United States Patent [19]

Kerth

[11] Patent Number: 5,477,481
[45] Date of Patent: Dec. 19, 1995

[54] SWITCHED-CAPACITOR INTEGRATOR WITH CHOPPER STABILIZATION PERFORMED AT THE SAMPLING RATE

[75] Inventor: Donald A. Kerth, Austin, Tex.

[73] Assignee: Crystal Semiconductor Corporation, Austin, Tex.

[21] Appl. No.: 221,985

[22] Filed: Apr. 1, 1994

Related U.S. Application Data

[63] Continuation of Ser. No. 711,287, Jun. 6, 1991, abandoned, which is a continuation-in-part of Ser. No. 656,294, Feb. 15, 1991, abandoned.

[51] Int. Cl.$^6$ .................................................. G06G 7/02
[52] U.S. Cl. ........................................................... 364/825
[58] Field of Search ................................. 364/825, 828, 364/829, 839, 724.1; 341/77, 123, 143

[56] References Cited

U.S. PATENT DOCUMENTS

| | | | |
|---|---|---|---|
| 4,746,899 | 5/1988 | Swanson et al. | 364/724.10 |
| 4,803,650 | 2/1989 | Nishimura et al. | 364/825 |
| 4,912,423 | 3/1990 | Milkovic et al. | 330/9 |
| 4,939,516 | 7/1990 | Early | 341/143 |
| 4,994,805 | 2/1991 | Dedic et al. | 341/143 |
| 4,999,634 | 3/1991 | Brazdrum et al. | 341/143 |
| 5,039,989 | 8/1991 | Welland et al. | 341/143 |
| 5,057,839 | 10/1991 | Koch | 341/143 |
| 5,072,219 | 12/1991 | Boutaud et al. | 341/143 |
| 5,079,550 | 1/1992 | Sooch et al. | 341/143 |
| 5,148,166 | 9/1992 | Ribner | 341/143 |
| 5,148,167 | 9/1992 | Ribner | 341/143 |
| 5,159,341 | 10/1992 | McCartney et al. | 341/143 |
| 5,168,461 | 12/1992 | Wu et al. | 364/825 |

*Primary Examiner*—Tan V. Mai
*Attorney, Agent, or Firm*—Robert D. Lott

[57] ABSTRACT

A switched-capacitor integrator with chopper stabilization performed at the sampling rate virtually eliminates the flicker noise and any low frequency interference generated by the amplifier. The integrator samples the input and then passes the sampled input to the feedback capacitor during each chopping phase of the amplifier to thereby provide a double-sampled integrator. The output of the integrator is sampled at the end of each cycle of the chopping signal.

18 Claims, 7 Drawing Sheets

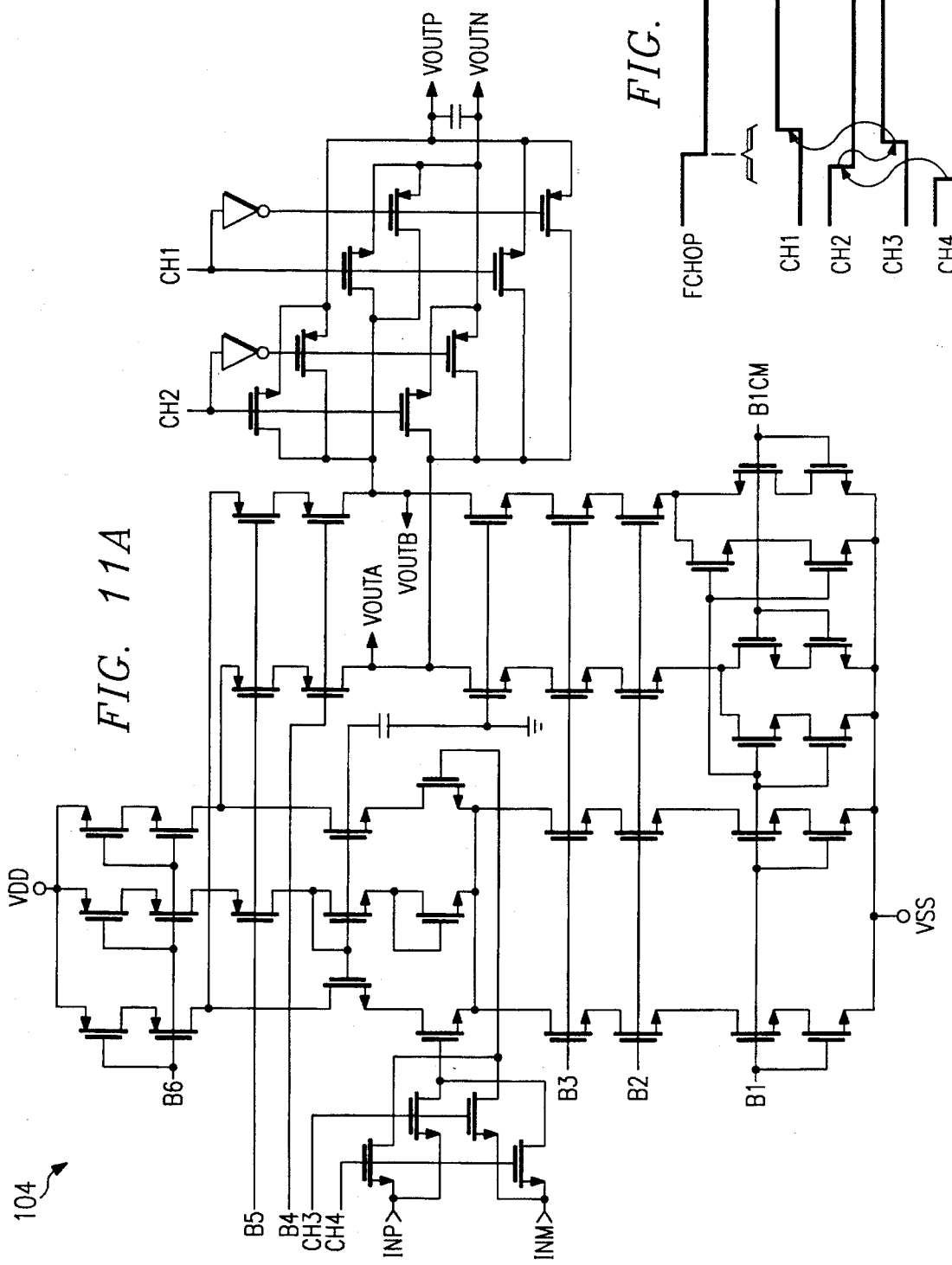

SWITCHED-CAPACITOR INTEGRATOR WITH CHOPPER STABILIZATION PERFORMED AT THE SAMPLING RATE

PRIOR APPLICATION

This is a continuation of application Ser. No. 07/711,287, filed on Jun. 6, 1991, now abandoned, which is a continuation-in-part of application Ser. No. 07/656,294 filed on Feb. 15, 1991, entitled "Method and Apparatus for Decreasing the Interference and Noise Sensitivity of a Ratiometric Converter Type of Circuit," now abandoned.

TECHNICAL FIELD

The present invention pertains in general to analog-to-digital converters, and more particularly, to discrete time analog-to-digital converters using a chopper stabilized amplifier.

BACKGROUND OF THE INVENTION

Discrete time filters using switched-capacitor integrators are used in a variety of applications. One such use is in the analog loop filter in the modulator of a delta-sigma analog-to-digital converter.

Unfortunately the amplifiers in integrators produce flicker (1/f) noise and low frequency interference which, in the first stage of a loop filter of a delta-sigma converter, degrades the performance of the converter. One method used in the past to attenuate the flicker noise and low frequency interference in switched-capacitor filters is to chopper stabilize the amplifier in the integrator. See, for example, Hsieh, et al. "A Low-Noise Chopper-Stabilized Differential Switched-Capacitor Filtering Technique," IEEE Journal of Solid-State Circuits, Vol. SC-16, No. 6, pp. 708–715. In this article, a system is described for modulating any flicker noise and low frequency interference out of the bandwidth of interest by chopper stabilization.

In the circuit described by Hsieh, and in other similar discrete time circuits, the chopping or modulation frequency is limited to below the circuit's Nyquist rate, typically one-half the sampling frequency. In these circuits, chopping above this frequency is inefficient, since the noise will alias back down into the Nyquist band once it is sampled. However, in a delta-sigma converter, chopper stabilization of a discrete time converter which is performed at or below half the sampling rate is a potential tone generation mechanism. This tone generation mechanism is discussed in U.S. patent application entitled "Delta-Sigma Analog-to-Digital Converter With Chopper Stabilization at the Sampling Frequency," Ser. No. 07/429,211 filed on Oct. 27, 1989, now U.S. Pat. No. 5,039,989. This application is assigned to the assignee of the present application, and is hereby incorporated by reference. This application describes a circuit in which chopper stabilization is performed at the same frequency as the sampling rate and uses a continuous time integrator to filter the modulated noise before it is sampled.

However, there are various applications where an all discrete time loop filter has certain advantages over a continuous time filter, or a mixture of a continuous time and discrete time loop filter. Therefore, it can be appreciated that a switched-capacitor integrator with chopper stabilization performed at the sampling rate is desirable.

SUMMARY OF THE INVENTION

It is therefore an object of this invention to provide a switched-capacitor integrator with chopper stabilization performed at the sampling rate.

It is also an object of this invention to provide a switched-capacitor integrator which attenuates flicker noise and low frequency interference in the integrator itself.

Shown in an illustrated embodiment of the invention is a switched-capacitor integrator having a sampled output and a chopper stabilized amplifier wherein the amplifier is chopped at a frequency greater than or substantially equal to the frequency that the output is sampled.

In a further aspect of the invention shown in the illustrated embodiment, the integrator has a first phase of operation and a second phase of operation and the integrator has an input capacitor and a feedback capacitor. During the first phase, the amplifier is in a first chopping state. The first phase is further divided into first and second subphases. During the first subphase, the input capacitor is charged by an input signal while the feedback capacitor is isolated from the input capacitor, and during the second subphase, the input capacitor is isolated from the input signal but coupled to the feedback capacitor to thereby transfer the input voltage sampled during the first subphase onto the feedback capacitor during the second subphase. During the second phase of the integrator, the amplifier is in a second chopping state, and the first and second subphases of the first phase are repeated. At the end of the second phase, the output of the integrator is sampled.

Also shown in an illustrated embodiment of the invention is a method for filtering an input signal. The input signal is sampled and the sampled signal is transferred to a feedback capacitor coupled between the output of an operational amplifier and a first input of the operational amplifier when the operational amplifier is in a first chopping state. The input signal is again sampled and the sampled signal is transferred to the feedback capacitor when the amplifier is in a second chopping state. While the operational amplifier is cycling through the first and second chopping states, the output is periodically sampled to provide the filtered output signal. The output is periodically sampled at a frequency substantially equal to FCHOP/N where N is a positive integer and FCHOP is the repetition rate of the first and second chopping states.

BRIEF DESCRIPTION OF THE DRAWINGS

The aforementioned and other features, characteristics, advantages, and the invention in general will be better understood from the following, more detailed description taken in conjunction with the accompanying drawings, in which:

FIG. 11A is a schematic diagram of the chopped amplifier shown in FIG. 9A; and

FIG. 11B is a timing diagram for the chopped amplifier shown in FIG. 11A.

Figure 1A:
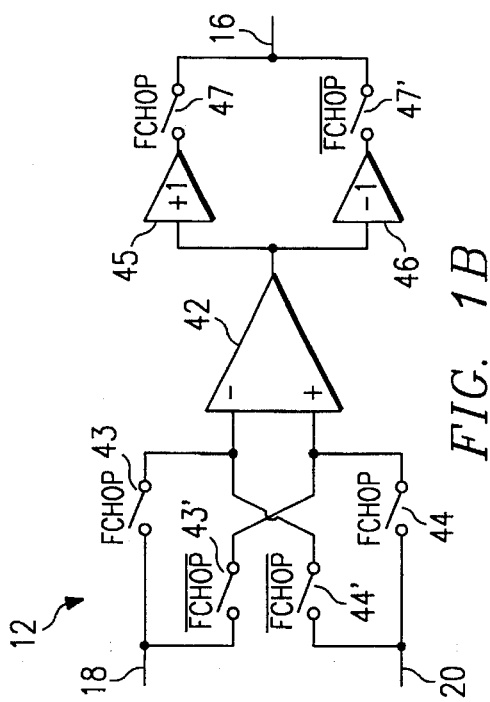
FIG. 1A is a schematic diagram of a switched-capacitor integrator according to the present invention.

It will be appreciated that for purposes of clarity and where deemed appropriate, reference numerals have been repeated in the figures to indicate corresponding features, and that the timing signals shown in the drawings have not necessarily been drawn to scale in order to more clearly show timing relationships in the preferred embodiment of the present invention.

DESCRIPTION OF THE PREFERRED EMBODIMENT

A switched-capacitor integrator with chopper stabilization performed at the sampling rate according to the preferred embodiment of the present invention comprises a chopped differential amplifier having first and second feedback capacitors, first and second input capacitors, and four switches around each input capacitor for receiving plus and minus differential input signals (VINP and VINM) and for providing positive and negative filtered output signals. The plus and minus input signals are both coupled to each input capacitor through separate switches. Two switches are on the opposite side of each of the first and second input capacitors with one switch coupled to ground and the other switch coupled to a first and second input, respectively, of the amplifier and to one terminal of the first and second feedback capacitors, respectively. The other terminals of the first and second feedback capacitors are connected to the first and second outputs, respectively, of the amplifier. The outputs of the amplifier are sampled to form the positive and negative outputs of the integrator.

In operation, the amplifier is chopped in response to a square wave signal FCHOP at a frequency equal to the sampling signal FSAMPLE. The FCHOP signal therefore has a first phase and a second phase. During the first phase, the amplifier is in a first chopping state in which the first input of the amplifier is a positive input, the second input is a negative input, the first output is a negative output and the second output is a positive output. During this first phase, the switches around the input capacitors are switched twice to thereby form two subphases. During the first subphase, the switches are set in a position to charge the first input capacitor to VINP while the first feedback capacitor is isolated from the first input capacitor, and to charge the second input capacitor to VINM while the second feedback capacitor is isolated from the second input capacitor. During the second subphase, the switches are set in a position to transfer the charge, relative to VINM, from the first input capacitor to the first feedback capacitor, and to transfer the charge, relative to VINP, from the second input capacitor to the second feedback capacitor. Thus, during the first subphase the input capacitors are charged to the input signals and the feedback capacitors are isolated from the input capacitors. During the second subphase, the input capacitors transfer their charge, relative to the opposite input signal, to the feedback capacitors. Also during this first phase the noise from the amplifier is sampled and stored on the first and second feedback capacitors along with the input signals.

During the second phase of the FCHOP signal, the amplifier is in a second chopping state, wherein the input and output polarities of the amplifier are switched such that the first input of the amplifier is a negative input, the second input is a positive input, the first output is a positive output and the second output is a negative output. The first and second subphases of the second phase (also referred to herein as the third and fourth subphases) are the same with respect to the switches around the input capacitors as the first and second subphases of the first phase of the FCHOP signal. During the second phase of FCHOP, the input signals are again added to the feedback capacitors but the low frequency amplifier noise stored during phase one is subtracted out by the noise stored during phase two. Thus, the flicker noise and low frequency interference is subtracted by this double sampled integration in contrast to modulating the low frequency interference and flicker noise out of the band of interest as was done by other prior art circuits. The output of the amplifier is sampled at the completion of the second phase of the FCHOP signal.

While in the preferred embodiment the output sampling frequency and chopping frequency are equal to each other, the flicker noise and low frequency interference is also attenuated when the chopping frequency is substantially equal to the output sampling frequency times N, where N is a positive integer. For example if N=2 then FCHOP would be twice FSAMPLE and the frequency of each input sample (i.e., the frequency of each of the four subphases) would be four times FSAMPLE.

Turning now to the drawings, FIG. 1A is a schematic diagram of a single-ended switched-capacitor integrator according to the present invention. As shown in FIG. 1A, the switched-capacitor integrator 10 includes a chopper stabilized differential operational amplifier 12, a feedback capacitor 14 coupled between an output 16 of the amplifier 12 and a first input 18 of the amplifier 12, with a second input 20 connected to signal ground. The amplifier 12 has signal inputs FCHOP and $\overline{\text{FCHOP}}$ on lines 22 and 23, respectively, which are produced by circuitry not shown in the drawings. The output of the amplifier 12 on line 16 is sampled by signal FSAMPLE shown by switch 24 to form the output signal VOUT at terminal 26. The switched-capacitor integrator 10 receives an input signal VIN at input terminal 28 which is coupled through a first switch 30 to a node 32. Node 32 is coupled to signal ground through a switch 34. Node 32 is connected to one terminal of an input capacitor 36 the other terminal of which is connected to another node 38. Node 38 is coupled to signal ground through a switch 40. Node 38 is coupled to the input 18 of the amplifier 12 through another switch 42. The switches 30 and 40 are controlled by timing signals φA, and the switches 34 and 38 are controlled by the timing signal φB.

Figure 1B:
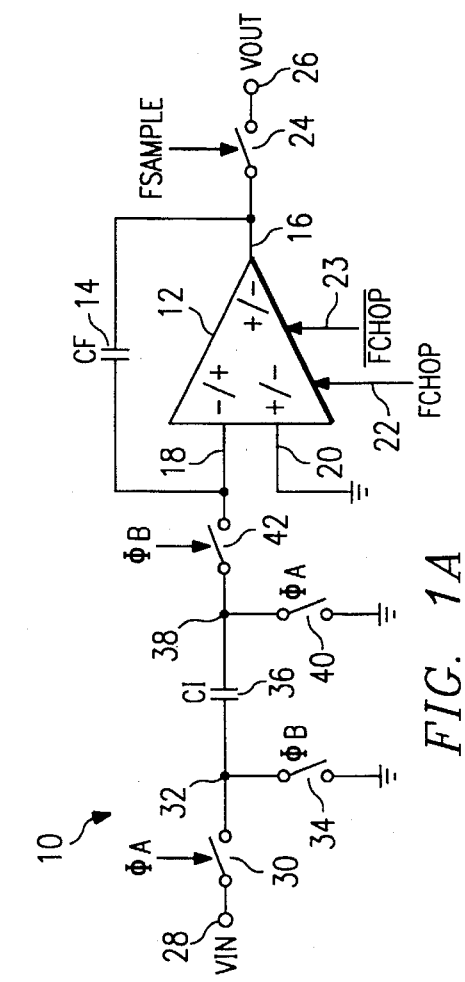
FIG. 1B is a schematic diagram of the chopped amplifier shown in FIG. 1A.

FIG. 1B is a schematic diagram of the chopped amplifier 12 of FIG. 1A. As shown in FIG. 1B the input 18 is coupled to the minus input of an operational amplifier 42 through a switch 43 controlled by FCHOP and to the positive input of the operational amplifier 42 through a switch 43' controlled by $\overline{FCHOP}$. The input 20 is coupled to the minus input of an operational amplifier 42 through a switch 44' controlled by $\overline{FCHOP}$ and to the positive input of the operational amplifier 42 through a switch 44 controlled by FCHOP. The output of the operational amplifier 42 is coupled to the output 16 of the chopped amplifier 12 through a noninverting amplifier 45 and a switch 47 controlled by FCHOP, and also through an inverting amplifier 46 and a switch 47' controlled by $\overline{FCHOP}$.

In operation the chopped amplifier 12 has a first chopping state and a second chopping state. During the first chopping state, when FCHOP is high and $\overline{FCHOP}$ is low, the switches 43, 44 and 47 are closed while the switches 43', 44' and 47' are open. In this first chopping state the input 18 is coupled to the minus input of the operational amplifier 42, the input 20 is coupled to the positive input of the operational amplifier 42, and the output of the operational amplifier 42 is coupled to the output 16. During the second chopping state, when FCHOP is low and $\overline{FCHOP}$ is high, the switches 43, 44 and 47 are open while the switches 43', 44' and 47' are closed. In this second chopping state the input 18 is coupled to the positive input of the operational amplifier 42, the input 20 is coupled to the minus input of the operational amplifier 42, and the output of the operational amplifier 42 is inverted and coupled to the output 16.

Figure 1C:
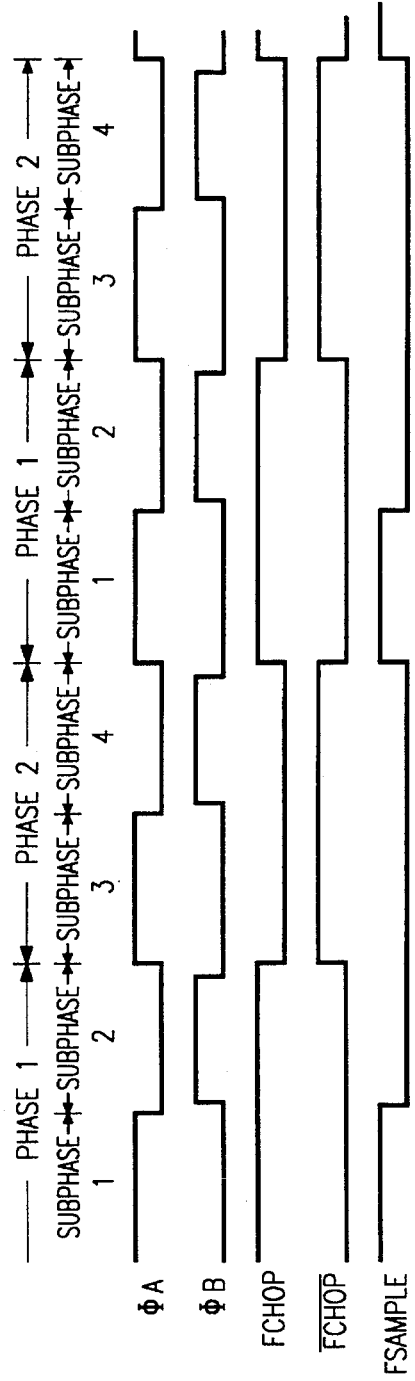
FIG. 1C is a timing diagram for the switched-capacitor integrator shown in FIG. 1A.
Figure 2A:
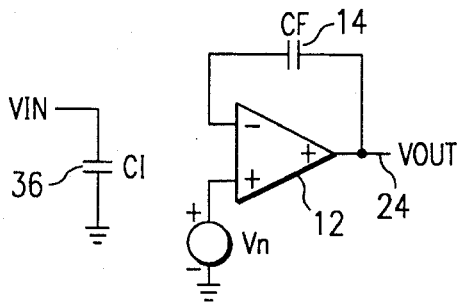
FIGS. 2A, 2B, 2C, and 2D are schematic diagrams of the switched-capacitor integrator of FIG. 1A for each of the four distinct subphases of the operation of the integrator over one sampling period.

FIG. 1C is a timing diagram for the circuit shown in FIG. 1A. As shown in FIG. 1C, for each sample of the output shown as FSAMPLE in FIG. 1C, there are two phases of the FCHOP and the $\overline{FCHOP}$ signals and four subphases of the φA and φB signals. FIG. 2A is a diagram of FIG. 1A during subphase one of the operation, FIG. 2B is a schematic of FIG. 1A during subphase two, FIG. 2C is a schematic diagram during subphase three, and FIG. 2D is a schematic diagram during subphase four.

Figure 2B:
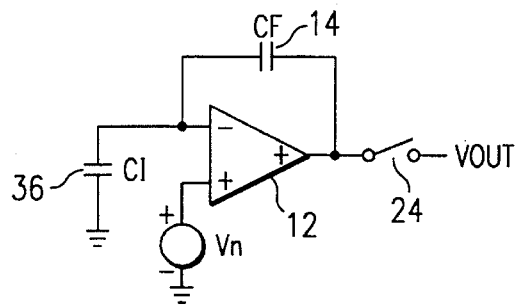
Figure 2C:
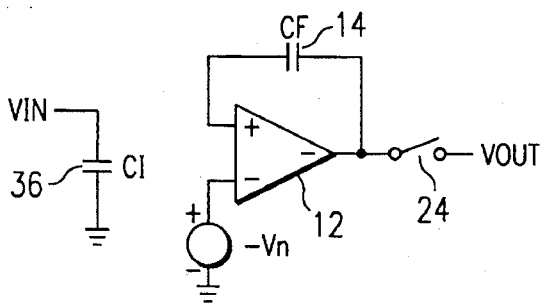
Figure 2D:
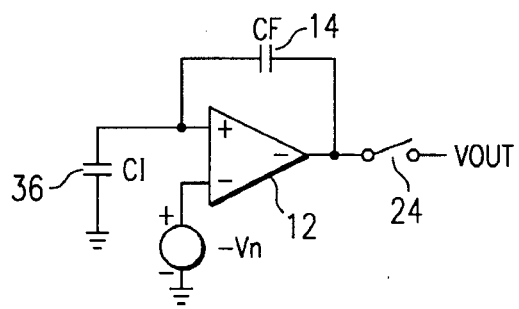

With reference now to FIG. 1B and FIGS. 2A, 2B, 2C, and 2D, the operation of the amplifier shown in FIG. 1A will be described. During subphase one, (shown in FIG. 2A) the amplifier 12 has a negative input at input 18 and a positive input at input 20 and a positive output at the output 16, and the switches 30 and 40 are closed while the switches 34 and 42 are open. During this first subphase, the input signal VIN is sampled on the input capacitor 36 while the feedback capacitor 14 stores the voltage from subphase four of the previous cycle. During subphase two (shown in FIG. 2B) the input terminals 18 and 20 and the output terminal 16 of the amplifier 12 remain unchanged in polarity and switches 34 and 42 are closed while switches 30 and 40 are open. During this subphase, a sampled input on capacitor 36 is passed to the feedback capacitor 14. Also during this subphase the amplifier noise, as represented by Vn if FIG. 2B, is sampled and subtracted from the feedback capacitor 14.

During subphase three (shown in FIG. 2C) the input 18 of the amplifier 12 becomes a positive input, the input 20 becomes a negative input, and the output 16 becomes a negative output since the signals FCHOP and $\overline{FCHOP}$ change polarity. Also, at this time the switches 30, 34, 38, and 40 are in the same position they were during subphase one. Thus, during this third subphase, the input signal VIN is sampled on the input capacitor 36 while the voltage on the feedback capacitor 14 remains unchanged. During subphase four (shown in FIG. 2D) the inputs 18 and 20 and the output 16 of the amplifier 12 remain unchanged from the third subphase, and the switches 30, 34, 40, and 42 are switched to the same position they are in subphase two. During this fourth subphase, the sampled input on the input capacitor 36 is added (transferred) to the feedback capacitor 14. Also, the inverse of the noise of the amplifier 12 is sampled and subtracted from the feedback capacitor 14. In this manner, the low frequency interference and the flicker noise of the amplifier 12 is removed from the output signal on the output terminal 26. In the preferred embodiment the output of the switched-capacitor integrator 10 is sampled during the first subphase by the closure of the switch 24. However, as will be shown below, since the output of the integrator 24 is the same during the fourth subphase and the first subphase of the next cycle, the sampling can also occur during the fourth subphase.

Since there are two subphases for every phase of the chopping clocks FCHOP and $\overline{FCHOP}$, the switched-capacitor integrator 10 of FIG. 1A is a double-sampled integrator. Also, since the chopping clocks FCHOP and $\overline{FCHOP}$ are the same frequency as the sampling signal FSAMPLE, then the input signal VIN is sampled at twice the frequency as the output sample FSAMPLE.

Figure 3A:
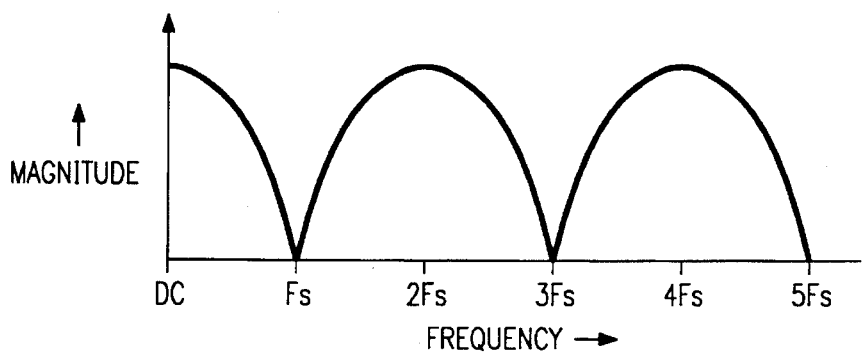
FIG. 3A is a plot of the input transfer function of the switched-capacitor integrator of FIG. 1A.
Figure 3B:
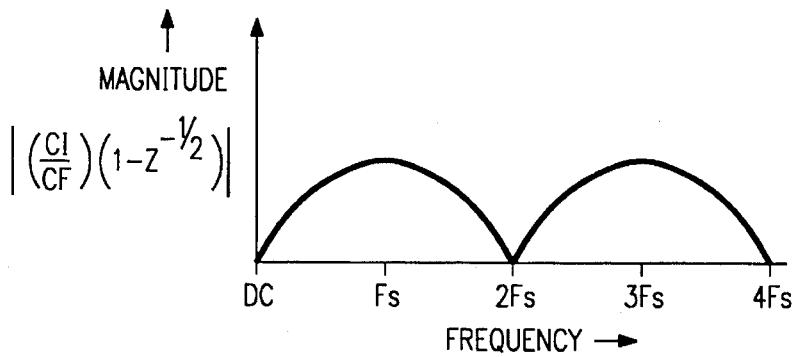
FIG. 3B is a plot of the noise transfer function of the switched-capacitor integrator of FIG. 1A.

FIG. 3A is a plot of the input referred transfer function of the amplifier shown in FIG. 1A, and FIG. 3B is a plot of the noise input referred transfer function of the amplifier shown in FIG. 1A. These two curves can be derived by summing the voltages added to the feedback capacitor 14 for each of the four subphases and adding it to the voltage present at the fourth subphase of the previous cycle and then taking the Z-transform of the resultant output voltage. Thus the voltage at the end of sample n is equal to the voltage at the end of sample n–1 plus the voltage from the end of the first subphase (which occurs at n–¾) plus the voltage at the end of the second subphase (which occurs at n–½) plus the voltage at the end of the third subphase (which occurs at n–¼) plus the incremental voltage at the end of the fourth subphase (which occurs at n). For subphase 1:

$$VOUT(n-\tfrac{3}{4}) = VOUT(n-1) \qquad (1)$$

For subphase 2:

$$VOUT(n - \tfrac{1}{2}) = VOUT(n - 1) + \frac{CI}{CF}[VIN(n - \tfrac{3}{4}) - Vn(n - \tfrac{1}{2})] \qquad (2)$$

For subphase 3:

$$VOUT(n - \tfrac{1}{4}) = VOUT(n - \tfrac{1}{2}) \qquad (3)$$

For subphase 4:

$$VOUT(n) = VOUT(n - 1) + \frac{CI}{CF}[VIN(n - \tfrac{3}{4}) + VIN(n - \tfrac{1}{4}) - Vn(n - \tfrac{1}{2}) + Vn(n)] \qquad (4)$$

where Vn is the sampled amplifier noise.

Taking the Z-transform of equation (4) yields $$VOUT(Z) = \frac{CI/CF}{1-Z^{-1}} [Z^{-1/4} + Z^{-3/4}]VIN(Z) + \quad (5)$$

$$\frac{CI/CF}{1-Z^{-1}} [Z^{-1/2}]Vn(Z)$$

Therefore, the input transfer function is $$\frac{CI/CF}{1-Z^{-1}} [Z^{-1/4} + Z^{-3/4}] \quad (6)$$

and the noise transfer function is $$\frac{CI/CF}{1-Z^{-1}} [Z^{-1/2}] \quad (7)$$

The $$\frac{CI/CF}{1-Z^{-1}}$$

term in the input and noise transfer functions is the familiar discrete-time integrator. The numerators of these transfer functions is what determines their input referred response. Their steady state response is shown in FIGS. 3A and 3B respectively. Note that the noise transfer function has a zero at DC.

Figure 4A:
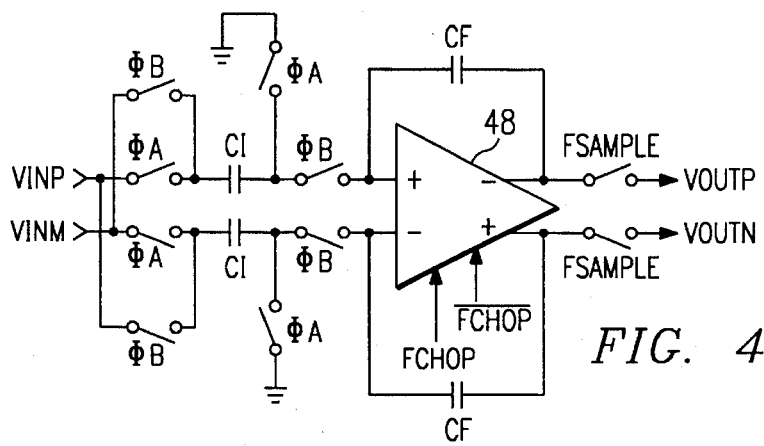
FIG. 4A is a schematic diagram of a fully differential switched-capacitor integrator according to the present invention.

FIG. 4A is a schematic diagram of a fully differential version of the switched-capacitor integrator shown in FIG. 1A. This fully differential version, which utilizes a fully differential chopped amplifier 48, is the preferred embodiment of the present invention. The circuit shown in FIG. 4A operates according to the same principles described above with respect to the circuit shown in FIG. 1A, and the timing of the switches shown is FIG. 4A is the same timing shown in FIG. 1C.

More specifically, for subphase 1:

$$VOUT(n-\text{¾})=VOUT(n-1) \quad (9)$$

For subphase 2:

$$VOUT(n - \text{½}) = VOUT(n - 1) + \quad (10)$$

$$\frac{CI}{CF} [VIN(n - 3/4) + VIN(n - 1/2) - Vn(n - 1/2)]$$

For subphase 3:

$$VOUT(n-\text{¼})=VOUT(n-\text{½}) \quad (11)$$

For subphase 4:

$$VOUT(n) = VOUT(n-1) + \frac{CI}{CF} [VIN(n - 3/4) + \quad (12)$$

$$VIN(n - \text{½}) + VIN(n - \text{¼}) +$$

$$VIN(n) - Vn(n - \text{½}) + Vn(n)]$$

Taking the Z-transform of equation (12) yields $$VOUT(Z) = \frac{CI/CF}{1-Z^{-1}} [1 + Z^{-1/4} + Z^{-1/2} + Z^{-3/4}]VIN(Z) + \quad (13)$$

$$\frac{CI/CF}{1-Z^{-1}} [1 - Z^{-1/2}]Vn(Z)$$

The input transfer function thus becomes:

$$\frac{CI/CF}{1-Z^{-1}} [1 + Z^{-1/4} + Z^{-1/2} + Z^{-3/4}] \quad (14)$$

Figure 5:
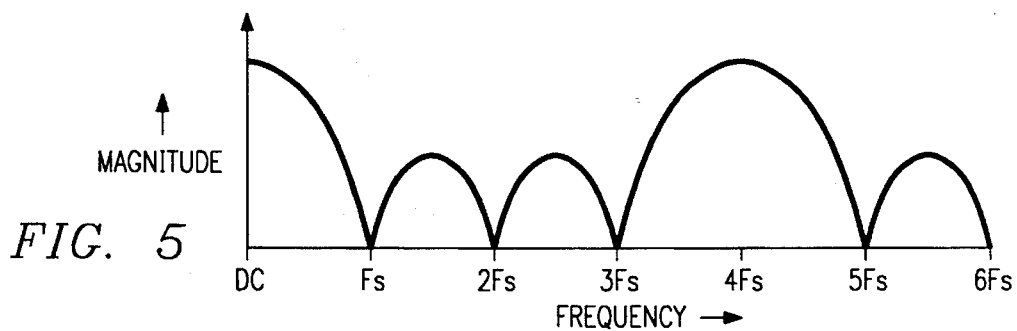
FIG. 5 is a plot of the input transfer function of the switched-capacitor integrator of FIG. 4A.

The noise transfer function is the same as equation (7). FIG. 5 is a plot of the input referred input transfer function of the circuit shown in FIG. 4A. The curve shown in FIG. 3B is applicable to the circuit shown in FIG. 4A.

Figure 4B:
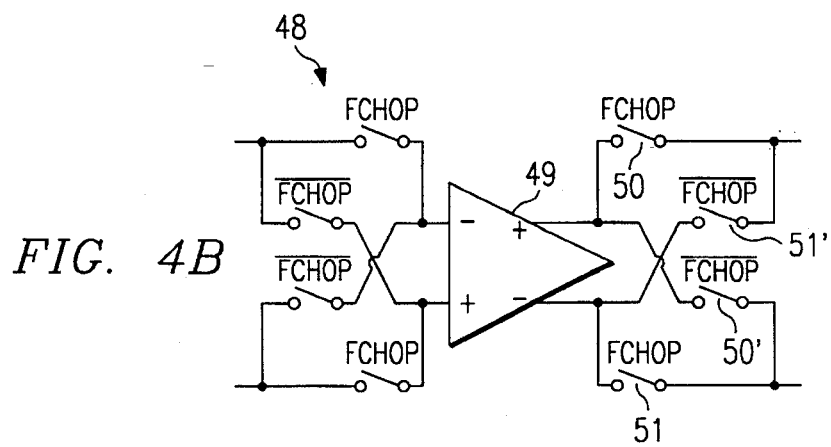
FIG. 4B is a schematic diagram of the chopped amplifier shown in FIG. 4A.

FIG. 4B is a schematic diagram of the chopped amplifier shown in FIG. 4A. As shown in FIG. 4B an operational amplifier 49 has minus and plus inputs which are switched in the same manner as the chopped amplifier shown in FIG. 1B. The positive and negative outputs of the amplifier 49 are switched by switches 50 and 51, controlled by the FCHOP signal, and switches 50' and 51' controlled by the $\overline{FCHOP}$ signal.

Figure 4C:
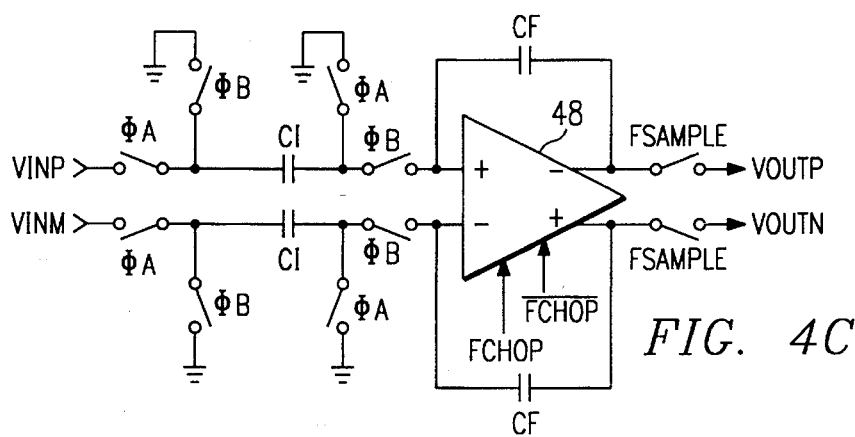
FIG. 4C is a schematic diagram of another embodiment of a fully differential switched-capacitor integrator according to the present invention.

FIG. 4C is an alternate embodiment of a fully differential switched-capacitor integrator according to the present invention. In the embodiment shown in FIG. 4C each of the first terminals of the input capacitors, CI, are alternatively connected between an input signal (VINP or VINM) and signal ground rather than between one input signal and the other input signal as shown in FIG. 4A.

Figure 6:
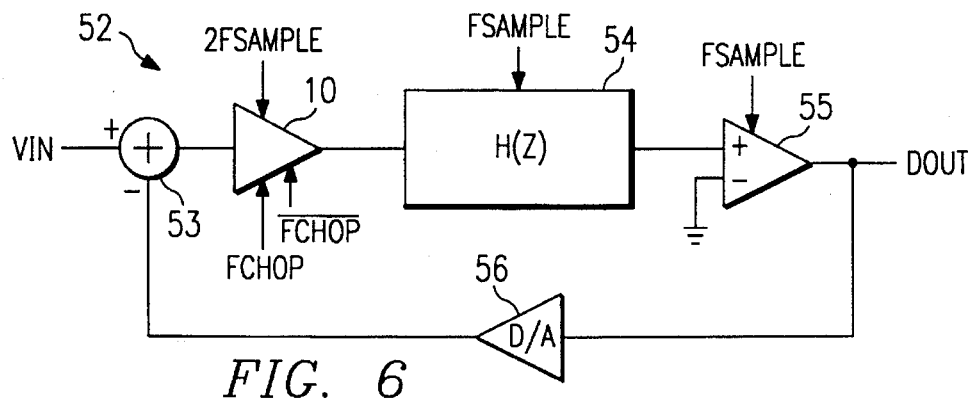
FIG. 6 is a block diagram of a delta-sigma converter which includes a switched-capacitor integrator according to the present invention.

FIG. 6 is a block diagram of a delta-sigma converter 52 which includes a switched-capacitor integrator according to the present invention. As shown in FIG. 6 the input signal VIN is connected to the positive input of a summing circuit 53. The output of the summing circuit is connected to the input of the switched-capacitor integrator 10. The output of the switched-capacitor integrator 10 is connected to an input of a block 54 of conventional switched-capacitor integrators to form the rest of the analog loop filter. The output of the block 54 of conventional switched-capacitor integrators is connected to the input of a quantizer 55 the output of which forms the digital output signal DOUT. The DOUT signal is connected to the input of a D/A converter 56, the output of which is connected to the minus input of the summing circuit 50.

In operation the input signal VIN is summed with an analog signal produced by the D/A converter 56 in the summing circuit 53 and this sum is connected to the input of the switched-capacitor integrator 10. Only the first integrator 10 is double-sampled since the later integrators do not contribute significant low frequency noise. As described above, this switched-capacitor integrator 10 provides effective attenuation of the low frequency noise interference of the amplifier 12, and since the double-sampled integrator 10 is chopped at the modulator sampling rate, the tone mechanisms which occur when the integrator is chopped at one-half the sampling rate are eliminated. The output of the switched-capacitor integrator 10 is then further filtered by the conventional switched-capacitor integrator block 54 and the output of this switched-capacitor integrator block 54 is quantized in the quantizer 55 to form the output signal DOUT. The output of the quantizer 55 is converted to an analog signal in the D/A converter 56. The output signal DOUT is conventionally coupled to the input of a digital decimation filter which converts the oversampled serial bitstream of DOUT into a conventional digital signal and which also provides filtering of DOUT.

Figure 7:
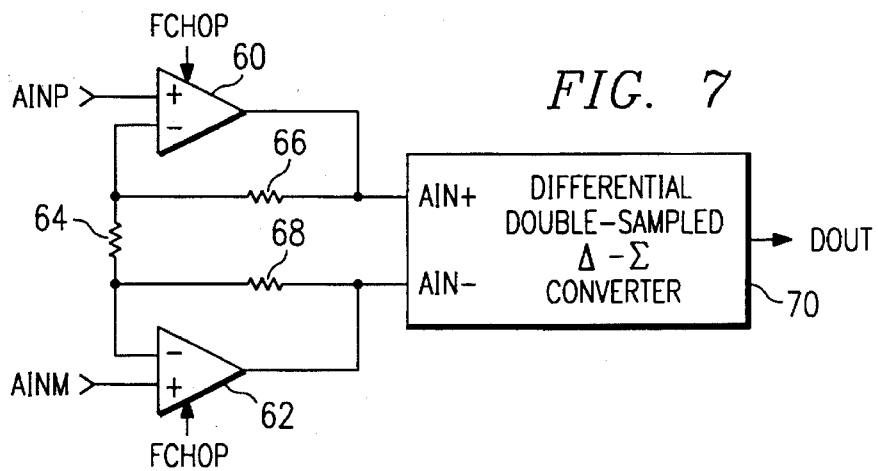
FIG. 7 is a block diagram of an application of the present invention which includes a delta-sigma converter with a switched-capacitor integrator according to the present invention.

FIG. 7 is a block diagram of an instrumentation amplifier which utilizes the present invention. As shown in FIG. 7, two differential input signals AINP and AINM are connected to the positive inputs of two chopper-stabilized differential amplifiers 60 and 62 respectively. The negative inputs of the amplifiers 60 and 62 are coupled together through a resistor 64 and the output of the amplifier 60 is connected to its negative input through a feedback resistor 66. The output of the operational amplifier 62 is connected to its negative input through feedback resistor 68. The output of the amplifier 60 is connected to the AIN+ input of a differential double-sampled delta-sigma converter 70. The amplifier 62 is connected to the AIN− input of the delta-sigma converter 70. The amplifiers 60 and 62 are chopped at the sampling frequency of the delta-sigma converter 70. The chopper stabilized amplifiers 60 and 62 modulate the flicker noise and low frequency interference to odd harmonics of the chopping frequency, which is the same as the sampling frequency, and the switched-capacitor integrator of the first filter stage of the delta-sigma converter 70 suppresses this modulated noise and interference since the input referred transfer function of the switch-capacitor integrator has nulls at odd harmonics of the sampling frequency as shown in FIG. 3A. The amplifiers 60 and 62 also provide a high input impedance to the input signals AINP and AINM.

While in the preferred embodiment of FIG. 7 the first stage of the delta-sigma converter 70 is chopper stabilized, the present invention is also applicable to FIG. 7 when none of the stages of the delta-sigma converter 70 are chopper stabilized. That is the modulated noise is suppressed in the delta-sigma converter 70 when the sample frequency of the delta-sigma converter 70 is equal to the chopping frequency of the chopper-stabilized differential amplifiers 60 and 62 (or equal to the chopping frequency divided by a positive integer), and the input sampling frequency of the delta-sigma converter 70 is twice the chopping frequency of the chopper-stabilized differential amplifiers 60 and 62.

Figure 8:
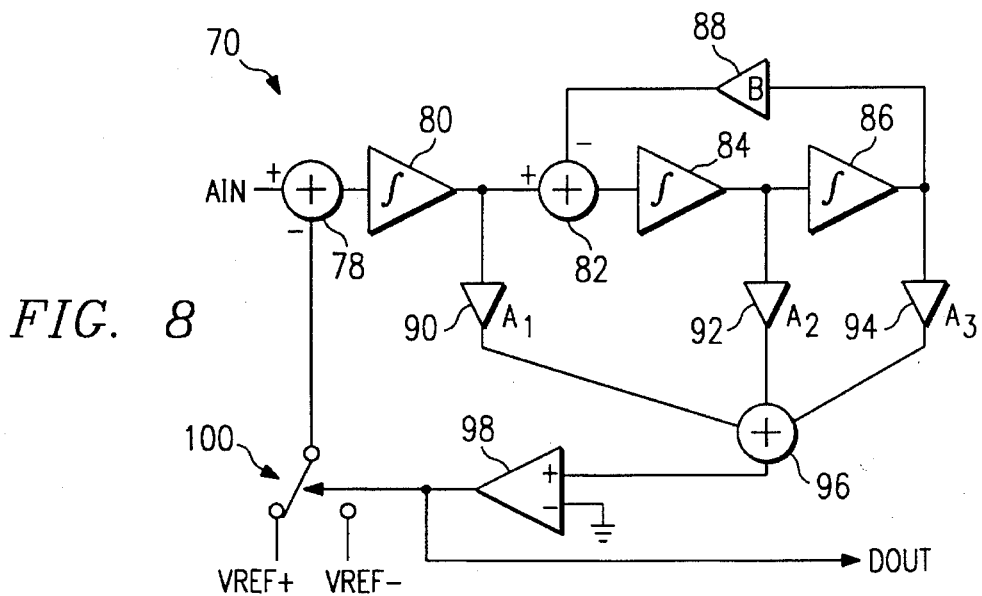
FIG. 8 is a block diagram of the delta-sigma converter shown in FIG. 7.

FIG. 8 is a block diagram of the delta-sigma converter 70 shown in FIG. 7. As shown in FIG. 8, the input signal AIN is connected to a positive input of a summing circuit or adder 78. It will be understood that the input AIN in FIG. 8 represents the differential input signals AIN+ and AIN− of FIG. 7. The output of the adder 78 is connected to the input of a first integrator stage 80, the output of which is connected to the positive input of a second adder 82. The output of the adder 82 is connected to the input of a second integrator 84, the output of which is connected to the input of a third integrator 86. The output of the integrator 86 is coupled to the input of a feedback element 88 shown as B. The output of the feedback element 88 is connected to the negative input of the adder 82. The output of the integrator 80 is connected to the input of a feedforward element 90, shown as A$_1$. The output of the integrator 84 is connected to the input of a second feedforward element 92 shown as A$_2$. The output of the integrator 86 is connected to the input of a third feedforward element 94 shown as A$_3$. The outputs from the three feedforward elements 90, 91, and 92 are added together at an adder 96 and the output of the adder 96 is connected to the positive input of a quantizer or comparator 98. The negative input at the comparator 98 is shown connected to signal ground for purposes of this block diagram representation of the preferred embodiment. The output of the comparator 98 forms the output signal DOUT. The output of the comparator 98 also is used to control a switch 100 which selects between a positive reference voltage, VREF+, and a negative reference voltage, VREF−, to be connected to the negative input of the adder 78.

The delta-sigma modulator 70 shown in FIG. 8 is a third order modulator which operates according to the principles well known to those skilled in the delta-sigma modulators.

Figure 9A:
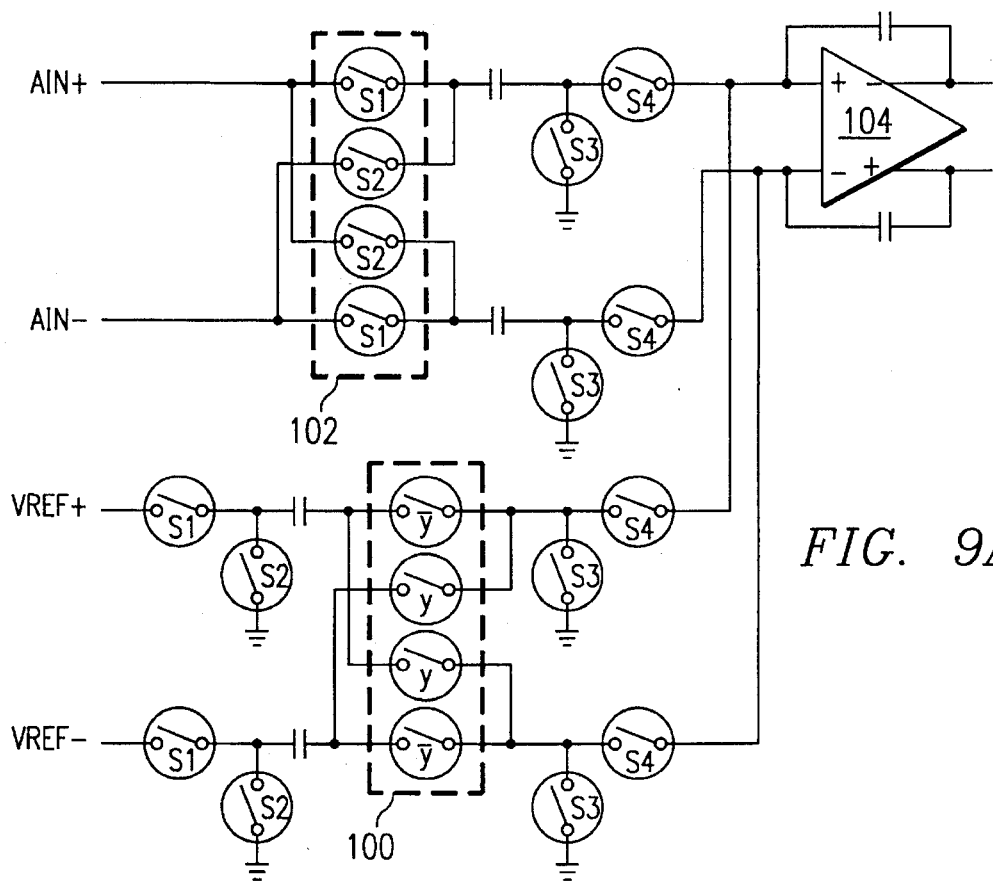
FIGS. 9A and 9B are schematic diagrams of the delta-sigma converter shown in FIG. 8.
Figure 9B:
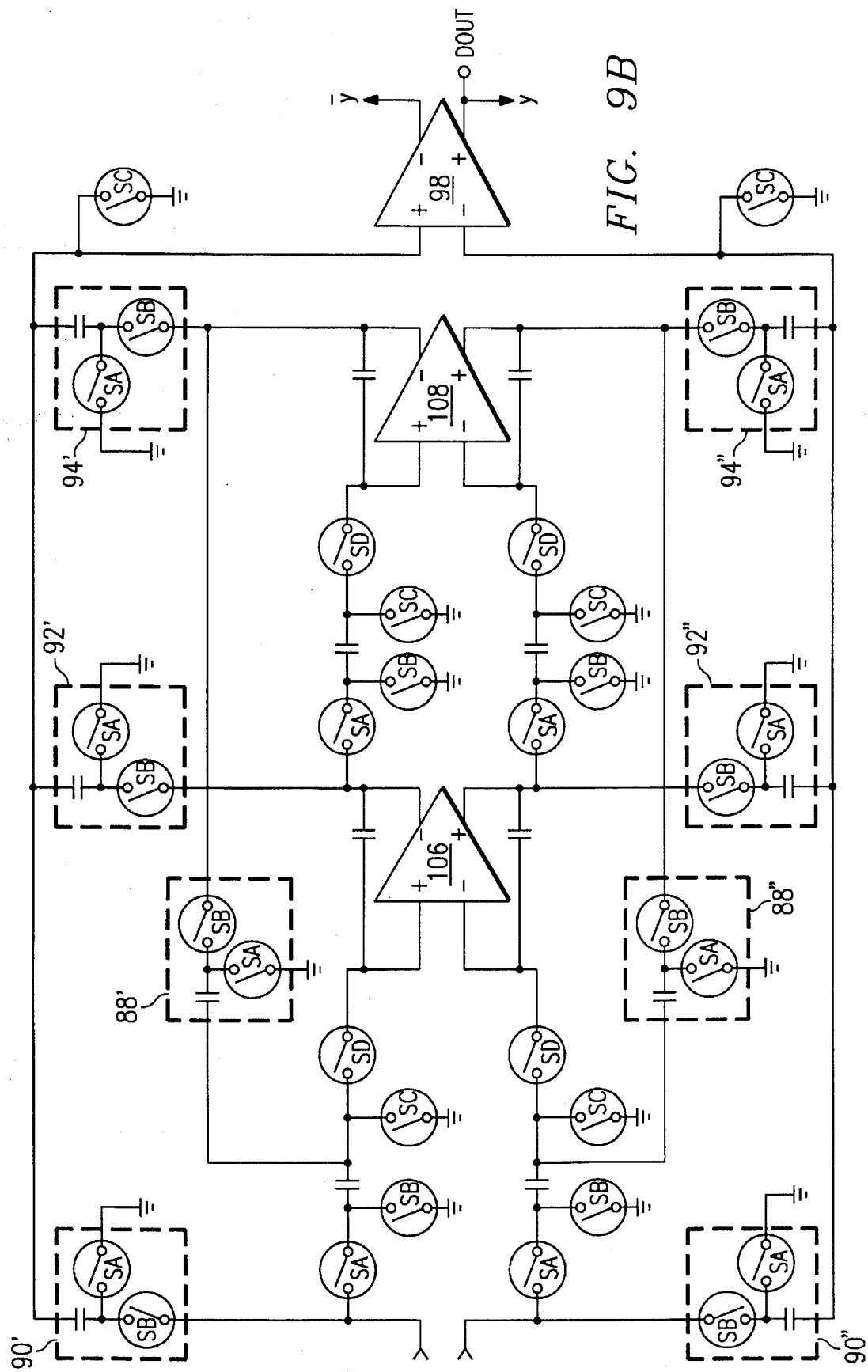

FIGS. 9A and 9B form a schematic diagram of the delta-sigma modulator 70 shown in FIG. 8. As shown in FIG. 9A, the input signals AIN+ and AIN− are cross coupled before the first capacitor elements in the manner shown in FIG. 4A. These are cross coupled by switches shown in block 102. The operational amplifiers 104, 106, and 108 of FIGS. 9A and 9B form the active elements of the integrators 80, 84, and 86, respectively, shown in FIG. 8. The feedback element 88 in FIG. 8 is a differential feedback element in FIG. 9B, shown as elements 88' and 88". Similarly, the feed forward elements 90, 92, and 94 are shown as elements 90' and 90", 92' and 92", and 94' and 94" respectively in FIG. 9B.

Figure 10:
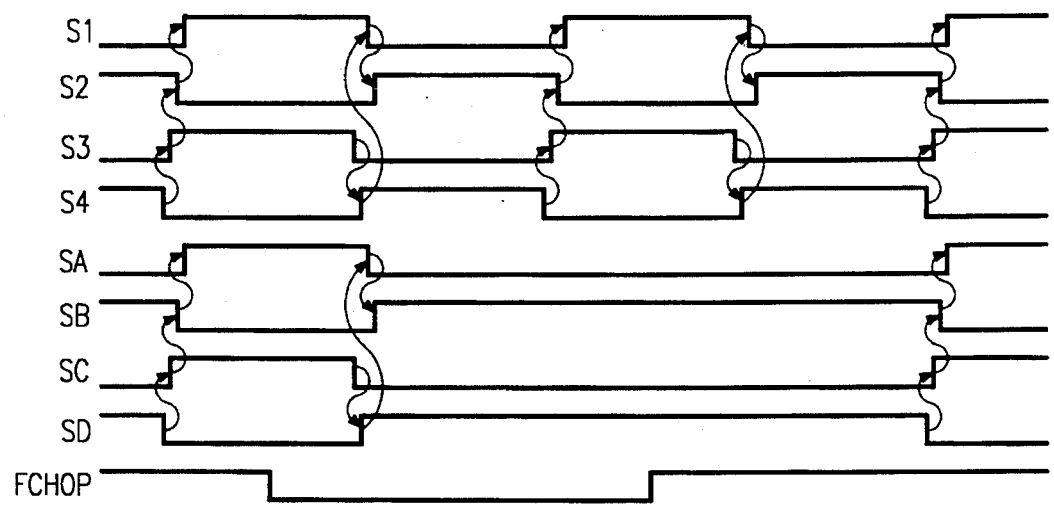
FIG. 10 is a timing diagram of the switches shown in FIGS. 9A and 9B.

FIG. 10 is a timing diagram of the switches shown in FIG. 9A and 9B. The arrows indicate the sequence of switching at the phase boundaries of the signals S1–S4 and SA–SD. The signal FCHOP is the chopping signal used to chop, or switch, the inputs and outputs of the operational amplifier 104, and the instrumentation amplifiers 60 and 62.

It will be appreciated that the integrator 80 is a discrete time integrator in which the operational amplifier 104 is chopped at the sampling frequency. This ability to chop at the sample rate in a discrete time circuit arises from the timing signals S1–S4 which double sample the input signal at a rate which is twice the sample rate of the modulator. This circuit then takes advantage of the flicker and low frequency interference rejection of a chopper stabilized amplifier without introducing tones or requiring a continuous time integrator to precede the discrete time integrator.

FIG. 11A is the schematic diagram of the preferred embodiment of the chopped amplifier 104 shown in FIG. 9A. As shown in FIG. 11A the differential input signals INP and INM are switched at the input of the amplifier 104 by timing signals CH3 and CH4. The differential outputs of the amplifier 104 are also switched by timing signals CH1 and CH2. The amplifier itself is of a design well know in the art with B1–B6 being bias voltages, and B1CM being a bias voltage driven by a common mode amplifier (not shown) which receives VOUTP and VOUTN as input signals. B1CM operates to keep the common mode output of the amplifier at substantially half way between VDD and VSS. FIG. 11B shows the timing relationships of CH1–CH4 in relation to FCHOP which is also shown in FIG. 10.

Although the invention has been described in part by making detailed reference to a certain specific embodiment, such detail is intended to be, and will be understood to be, instructional rather than restrictive. It will be appreciated by those skilled in the art that many variations may be made in the structure and mode of operation without departing from the spirit and scope of the invention as disclosed in the teachings contained herein.

What is claimed is:

1. A switched-capacitor circuit having a sampled output comprising:

a) a discrete time charge transfer circuit coupled to an input signal;

b) a chopper stabilized amplifier coupled to said discrete time charge transfer circuit and to a chop clock signal; and c) a sampling circuit coupled between said chopper stabilized amplifier and said sampled output, said sampling circuit also coupled to a sampling clock signal, d) wherein said amplifier is chopped at a frequency greater than or substantially equal to the frequency that said output is sampled.

2. A switched-capacitor circuit as set forth in claim 1 wherein said switched-capacitor circuit is an integrator circuit.

3. A switched-capacitor circuit as set forth in claim 2 wherein said integrator is a double sampled integrator.

4. A switched-capacitor circuit as set forth in claim 1 wherein said switched-capacitor circuit is fully differential.

5. A switched capacitor circuit for receiving an input signal at an input terminal and for providing an output signal, comprising:
   a) a chopped amplifier having first and second inputs and an output and having first and second chopping states;
   b) a feedback capacitor coupled between said output of said amplifier and said first input of said amplifier;
   c) an input capacitor having a first terminal selectively coupled to said input terminal and to signal ground, and said input capacitor having a second terminal selectively coupled to said first input of said amplifier and to signal ground;
   d) wherein said input capacitor is alternately (i) charged to a signal at said input terminal and (ii) coupled to said first input of said amplifier to thereby transfer its charge to said feedback capacitor during each chopping state of said amplifier; and
   e) said output of said amplifier is sampled, to provide said output signal, at a frequency less than or substantially equal to the chopping frequency of said amplifier.

6. A switched capacitor circuit for receiving first and second input signals at first and second input terminals, respectively, and for providing first and second output signals, respectively, comprising:
   a) a chopped amplifier having first and second inputs and first and second outputs and having first and second chopping states;
   b) a first feedback capacitor coupled between said first output of said amplifier and said first input of said amplifier, and a second feedback capacitor coupled between said second output of said amplifier and said second input of said amplifier;
   c) a first input capacitor having a first terminal selectively coupled to said first input terminal and to said second input terminal, and said first input capacitor having a second terminal selectively coupled to said first input of said amplifier and to signal ground;
   d) wherein said first capacitor is alternately (i) charged to a signal at said first input terminal and (ii) coupled to said first input of said amplifier and to said second input terminal to thereby transfer its charge to said first feedback capacitor during each chopping state of said amplifier;
   e) a second input capacitor having a first terminal selectively coupled to said first input terminal and to said second input terminal, and said second input capacitor having a second terminal selectively coupled to said second input of said amplifier and to signal ground;
   f) wherein said second capacitor is alternately (i) charged to a signal at said second input terminal and (ii) coupled to said second input of said amplifier and to said first input terminal to thereby transfer its charge to said second feedback capacitor during each chopping state of said amplifier; and
   g) said first and second outputs of said amplifier are sampled, to provide said first and second output signals, respectively, at a frequency less than or substantially equal to the chopping frequency of said amplifier.

7. A switched capacitor circuit for receiving first and second input signals at first and second input terminals, respectively, and providing first and second outputs at first and second output terminals, respectively, comprising:
   a) a chopped amplifier having first and second inputs and first and second outputs and having first and second chopping states;
   b) a first feedback capacitor coupled between said first output of said amplifier and said first input of said amplifier, and a second feedback capacitor coupled between said second output of said amplifier and said second input of said amplifier;
   c) a first input capacitor having a first terminal selectively coupled to said first input terminal and to signal ground, and said first input capacitor having a second terminal selectively coupled to said first input of said amplifier and to signal ground;
   d) wherein said first capacitor is alternately (i) charged to a signal at said first input terminal and (ii) coupled to said first input of said amplifier to thereby transfer its charge to said first feedback capacitor during each chopping state of said amplifier;
   e) a second input capacitor having a first terminal selectively coupled to said second input terminal and to signal ground, and said second input capacitor having a second terminal selectively coupled to said second input of said amplifier and to signal ground;
   f) wherein said second capacitor is alternately (i) charged to a signal at said second input terminal and (ii) coupled to said second input of said amplifier to thereby transfer its charge to said second feedback capacitor during each chopping state of said amplifier; and
   g) said first and second outputs of said amplifier are sampled, to provide said first and second output signals, respectively, at a frequency less than or substantially equal to the chopping frequency of said amplifier.

8. An analog filter comprising a plurality of serially coupled discrete time integrator stages having a first stage coupled to an input terminal and a last stage coupled to an output terminal in which at least one integrator stage of said integrator stages is chopper stabilized at a frequency greater than or substantially equal to a sampling frequency of the remainder of said integrator stages.

9. An analog filter as set forth in claim 8 wherein said at least one integrator stage is the first integrator stage of said plurality of serially coupled discrete time integrator stages.

10. An analog filter as set forth in claim 9 wherein said first integrator stage is a double sampled integrator.

11. A plurality of serially coupled discrete time integrators in an analog-to-digital modulator wherein a first stage of said integrators is coupled to an input terminal and a last stage of said integrators is coupled to an output terminal characterized in that at least one integrator of said integrators contains an amplifier which is chopper stabilized at a frequency greater than or substantially equal to a sampling frequency of the remainder of said integrator stages.

12. A plurality of serially coupled discrete time integrators as set forth in claim 11 wherein said at least one integrator is the first integrator of said plurality of serially coupled discrete time integrator.

13. An analog-to-digital modulator including a summing circuit coupled to an analog loop filter, the output of said analog loop filter coupled to a quantizer, the output of said quantizer forming an output of said analog-to-digital modulator and also coupled to a digital-to-analog converter, the output of said digital-to-analog converter coupled to one input of said summing circuit, a second input of said summing circuit for receiving an analog input signal, wherein said analog loop filter comprises a plurality of serially coupled discrete-time integrators, the first integrator of said plurality of serially coupled discrete-time integrators is chopper stabilized at a frequency greater than or substantially equal to a sampling frequency of the remainder of said integrator stages.

14. An analog-to-digital modulator as set forth in claim 13 wherein first integrator is a double sampled integrator.

15. An amplifier having an input terminal and an output terminal, comprising:
  a) a first chopper stabilized circuit coupled to said input terminal of said amplifier, said first chopper stabilized circuit producing unwanted noise at a chopping frequency of said first chopper stabilized circuit; and
  b) a switched-capacitor circuit coupled between the output of said first chopper stabilized circuit and said output terminal, said switched-capacitor circuit having its input sampled at twice the chopping frequency of said first chopper stabilized circuit and M times an output sampling frequency of said switched-capacitor circuit, where M is a positive integer greater than or equal to two, to provide a noise transfer function which effectively attenuates said unwanted noise from said first chopper stabilized circuit.

16. An amplifier as set forth in claim 15 wherein said switched-capacitor circuit contains a chopper stabilized amplifier which is chopped at substantially the same frequency as said first chopper stabilized circuit and at substantially the same frequency as the output sampling frequency of said switched-capacitor circuit.

17. A method for filtering an input signal comprising the steps of:
  a) sampling said input signal and storing the sampled signal on an input capacitor;
  b) transferring said sampled signal to a feedback capacitor which is coupled between an output and a first input of a chopped amplifier when said chopped amplifier is in a first chopping state;
  c) sampling said input signal and storing the sampled signal on said input capacitor;
  d) transferring said sampled signal to said feedback capacitor which is coupled between said output and said first input of said chopped amplifier when said chopped amplifier is in a second chopping state; and
  e) sampling the output of said chopped amplifier to provide a filtered output signal, said output being sampled at a frequency substantially equal to the repetition rate of said first and second chopping states.

18. A method for filtering an input signal comprising the steps of:
  a) sampling said input signal and storing the sampled signal on an input capacitor;
  b) transferring said sampled signal to a feedback capacitor which is coupled between an output and a first input of a chopped amplifier when said chopped amplifier is in a first chopping state;
  c) sampling said input signal and storing the sampled signal on said input capacitor;
  d) transferring said sampled signal to said feedback capacitor which is coupled between said output and said first input of said chopped amplifier when said chopped amplifier is in a second chopping state;
  e) repeating steps a) through d) in succession; and
  f) periodically sampling the output of said chopped amplifier to provide a filtered output signal, said output being sampled at a frequency substantially equal to FCHOP/N where N is a positive integer and FCHOP is the repetition rate of said first and second chopping states.

* * * * *